United States Patent
Hatano et al.

(10) Patent No.: US 7,859,016 B2
(45) Date of Patent: *Dec. 28, 2010

(54) THIN FILM SEMICONDUCTOR DEVICE, POLYCRYSTALLINE SEMICONDUCTOR THIN FILM PRODUCTION PROCESS AND PRODUCTION APPARATUS

(75) Inventors: Mutsuko Hatano, Kokubunji (JP);
Shinya Yamaguchi, Mitaka (JP);
Yoshinobu Kimura, Tokyo (JP);
Seong-Kee Park, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/498,692

(22) Filed: Jul. 7, 2009

(65) Prior Publication Data

US 2009/0269892 A1    Oct. 29, 2009

Related U.S. Application Data

(60) Continuation of application No. 11/589,800, filed on Oct. 31, 2006, now Pat. No. 7,556,993, which is a continuation of application No. 10/862,399, filed on Jun. 8, 2004, now Pat. No. 7,172,932, which is a continuation of application No. 10/670,356, filed on Sep. 26, 2003, now Pat. No. 7,115,454, which is a division of application No. 09/791,853, filed on Feb. 26, 2001, now Pat. No. 6,756,614.

(30) Foreign Application Priority Data

Jan. 29, 2001    (JP)    ............................. 2001-019570

(51) Int. Cl.
*H01L 29/66*    (2006.01)

(52) U.S. Cl. ............................ 257/192; 257/66; 257/72; 257/E21.412

(58) Field of Classification Search ................. 257/57, 257/59, 72, 347, 66, 192; 438/22, 166, 795
See application file for complete search history.

(56) References Cited

U.S. PATENT DOCUMENTS

| | | | |
|---|---|---|---|
| 5,543,351 | A | 8/1996 | Hirai et al. |
| 5,624,860 | A | 4/1997 | Plumton et al. |
| 5,815,494 | A | 9/1998 | Yamazaki et al. |
| 5,818,076 | A * | 10/1998 | Zhang et al. ................. 257/255 |
| 6,303,963 | B1 | 10/2001 | Ohtani et al. |

(Continued)

FOREIGN PATENT DOCUMENTS

EP    0043691    A2    3/1991

(Continued)

*Primary Examiner*—Chuong A Luu
*Assistant Examiner*—Nga Doan
(74) *Attorney, Agent, or Firm*—Antonelli, Terry, Stout & Kraus, LLP.

(57) ABSTRACT

A process for producing an image display device using a thin film semiconductor device is provided which includes forming a polycrystalline semiconductor thin film on a substrate. A substantially belt-shaped crystal is formed which is crystallized so as to grow crystal grains in a direction substantially parallel to a scanning direction of a CW laser beam by scanning the CW laser beam along the substrate, thereby irradiating the CW laser beam on portions of the polycrystalline semiconductor thin film formed onto the substrate.

6 Claims, 9 Drawing Sheets

U.S. PATENT DOCUMENTS

| | | |
|---|---|---|
| 6,440,824 B1 | 8/2002 | Hayashi et al. |
| 6,451,631 B1 | 9/2002 | Grigoropoulos et al. |
| 6,635,554 B1 | 10/2003 | Im et al. |
| 6,756,614 B2 * | 6/2004 | Hatano et al. ............... 257/192 |
| 7,172,932 B2 | 2/2007 | Hatano et al. |
| 2001/0026835 A1 | 10/2001 | Tanaka |
| 2002/0031876 A1 | 3/2002 | Hara et al. |
| 2002/0040981 A1 * | 4/2002 | Yamazaki et al. ............. 257/65 |

FOREIGN PATENT DOCUMENTS

| | | |
|---|---|---|
| JP | 03068167 A | 7/1997 |
| JP | 09181325 A | 7/1997 |
| WO | WO 97/45827 | 1/1982 |

* cited by examiner

THIN FILM SEMICONDUCTOR DEVICE, POLYCRYSTALLINE SEMICONDUCTOR THIN FILM PRODUCTION PROCESS AND PRODUCTION APPARATUS

CROSS-REFERENCE TO RELATED APPLICATIONS

This application is a Continuation application of application Ser. No. 11/589,800, filed Oct. 31, 2006, now U.S. Pat. No. 7,556,993 which in turn, is a Continuation of application Ser. No. 10/862,399, filed Jun. 8, 2004 (now U.S. Pat. No. 7,172,932), which, in turn is a Continuation application of application Ser. No. 10/670,356, filed Sep. 26, 2003 (now U.S. Pat. No. 7,115,454), which, in turn, is a Divisional application of application Ser. No. 09/791,853, filed Feb. 26, 2001 (now U.S. Pat. No. 6,756,614); and the entire disclosures of which are hereby incorporated by reference.

DETAILED DESCRIPTION OF THE INVENTION

1. Field of the Invention

The present invention relates to a thin film semiconductor device having a polycrystalline semiconductor film, and a process and apparatus for producing a polycrystalline semiconductor film. The thin film semiconductor device of the present invention is useful for image display devices.

2. Related Art

The prior art process for crystallizing an amorphous silicon thin film by scanning with a pulse laser will be described with reference to FIG. 12. FIG. 12 shows the most general process for crystallizing with an excimer pulse laser of the prior art. The whole substrate is crystallized by irradiating a non-crystal silicon film 102, which was formed on a substrate 100 through an base film 101, with a laser beam 105 from a linear excimer laser having a width L of several millimeters on the substrate and moving the laser exposure position at intervals of 1 to several pulses. In this prior art process, crystal nuclei are formed at random upon laser exposure. In addition, the average distance between the formed crystal nuclei is 0.5 μm or less under ordinary laser annealing conditions. Therefore, the obtained polycrystalline silicon film 103 has a grain size of 0.5 μm or less and is not uniform in size.

Further, an international patent publication WO9745827 discloses the following process. That is, when the width L of the laser beam 105 shown in FIG. 12 is reduced to 0.5 μm or less and the position of the laser beam 105 having this shape is moved 0.5 μm or less each time to irradiate pulses, crystal grows in one direction with the initially formed crystal grains as seeds. The above one direction is a transverse direction, that is, a direction perpendicular to the thickness direction of the grown film.

In the above process of the prior art, as the time required for crystal growth is 100 ns or less, the obtained crystals have a grain size of 1 μm or less and are greatly nonuniform in grain size. The orientation of grains is out of order, the density of defects is large, and the roughness of the film surface is large. Therefore, it is impossible to grow polycrystalline silicon having a large grain size or to control the grain size or the position of the grain boundary accurately. Therefore, the grain boundary is included in the channel at random. Consequently, it is difficult to improve the characteristic properties, reliability and uniformity of TFT devices.

Since the beam must be converged to a size of 1 μm or less in the technology disclosed by the above international patent publication WO9745827, the energy of the laser is lost and the optical system of an irradiation laser become complicated. As the moving distance between laser pulses is 1 μm or less, it takes a long time to crystallize the whole substrate and it is difficult to improve throughput and reduce costs. Particularly, this process cannot be applied to a large-area substrate. Further, very small distance movement is easily influenced by vibration and involves a yield problem.

SUMMARY OF THE INVENTION

It is a first object of the present invention to provide a production process and apparatus for forming on an insulating substrate made from glass or the like a high-quality polycrystalline semiconductor film whose grain boundary, grain size and crystal orientation can be controlled and whose film roughness and crystal defects formed in crystallization process have been reduced, and to provide a thin semiconductor device comprising the above polycrystalline semiconductor film.

It is a second object of the present invention to provide a production process and apparatus for forming a low-cost and high-quality polycrystalline semiconductor film, which can reduce the number of production steps, can be applied to a large-area substrate and have a high throughput, and to provide a thin film semiconductor device comprising the above polycrystalline semiconductor film.

It is a third object of the present invention to provide a production process and apparatus for forming on an inexpensive insulating substrate made from glass or the like a high-quality polycrystalline semiconductor film which operates with high performance and high reliability and is excellent in uniformity among devices, and to provide a thin film semiconductor device comprising the above polycrystalline semiconductor film.

The major aspects of the present invention will be described below.

According to a first aspect of the present invention, there is provided a thin film semiconductor device which has an insulating substrate, a first semiconductor film which is a polycrystalline semiconductor film, a gate electrode formed on the first semiconductor film through a gate insulating film, first charge transmitting and receiving means and second charge transmitting and receiving means formed on the first semiconductor film at a predetermined interval therebetween, and a channel region formed between the first and second charge transmitting and receiving means, wherein the main orientation of the first semiconductor film constituting the channel region is {110} with respect to the main surface of the insulating substrate or the gate insulating film.

It is possible to provide a thin film semiconductor device having high reliability by selecting the main orientation of the semiconductor film of the channel region with respect to the main surface of the insulating substrate or the gate insulating film even when a polycrystalline semiconductor film is used. The method of controlling the main orientation of the polycrystalline film will be described hereinafter.

An MIS type thin film semiconductor device according to the present invention may vary in structure as follows.

(1) An MIS type thin film semiconductor device having a gate electrode which is formed on a predetermined polycrystalline semiconductor film through a gate insulating film.

(2) An MIS type thin film semiconductor device having a gate electrode which is formed below a predetermined polycrystalline semiconductor film through a gate insulating film.

(3) An MIS type thin film semiconductor device having a gate electrode which is formed on the side of a predetermined polycrystalline semiconductor film through a gate insulating film.

According to a second aspect of the present invention, there is provided a thin film semiconductor device which has an insulating substrate, a first semiconductor film which is a polycrystalline semiconductor film, a gate electrode formed on the first semiconductor film through a gate insulating film, first charge transmitting and receiving means and second charge transmitting and receiving means formed on the first semiconductor film at a predetermined interval therebetween, and a channel region formed between the first and second charge transmitting and receiving means, wherein the main orientation of the first semiconductor film constituting the channel region is {110} with respect to the main surface of the insulating substrate or the gate insulating film; and the first semiconductor film is essentially composed of crystal grains having an axis in a longitudinal direction of 45° or less with respect to a direction for connecting the first and second charge transmitting and receiving means in the channel region. This thin film semiconductor device is a more practical embodiment of the present invention.

In the thin film semiconductor device of the present invention, the first semiconductor film comprises a small inclination grain boundary having an angle of 75° or less with respect to a direction for connecting the first and second charge transmitting and receiving means.

According to a third aspect of the present invention, there is provided a thin film semiconductor device which has an insulating substrate, a first semiconductor film which is a polycrystalline semiconductor film, a gate electrode formed on the first semiconductor film through a gate insulating film, first charge transmitting and receiving means and second charge transmitting and receiving means formed on the first semiconductor film at a predetermined interval therebetween, and a channel region formed between the first and second charge transmitting and receiving means, wherein the main orientation of the first semiconductor film constituting the channel region is {110} with respect to the main surface of the insulating substrate or the gate insulating film; and the channel region of the first semiconductor film has crystal grains for connecting the first charge transmitting and receiving means and the second charge transmitting and receiving means.

The third aspect of the present invention is more preferred. That is, the channel region of the first semiconductor film is composed of crystal grains having such a length in a longitudinal direction as to connect the first charge transmitting and receiving means and the second charge transmitting and receiving means. Therefore, a thin film semiconductor device having higher reliability can be provided.

According to a fourth aspect of the present invention, there is provided a thin film semiconductor device which has an insulating substrate, a first semiconductor film which is a polycrystalline semiconductor film, a gate electrode formed on the first semiconductor film through a gate insulating film, first charge transmitting and receiving means and second charge transmitting and receiving means formed on the first semiconductor film at a predetermined interval therebetween, and a channel region formed between the first and second charge transmitting and receiving means, wherein the main orientation of the first semiconductor film constituting the channel region is {110} with respect to the main surface of the insulating substrate or the gate insulating film; and the main orientation of the surface of the first semiconductor film substantially perpendicular to a direction for connecting the first and second charge transmitting and receiving means is {100}. The channel region of the first semiconductor film is composed of crystal grains having a length in a longitudinal direction for connecting the first charge transmitting and receiving means and the second charge transmitting and receiving means, and the main orientation of the polycrystalline film is {100}, thereby making it possible to provide a thin film semiconductor device having extremely high reliability. Briefly speaking the conclusion, this is because each crystal grain has the same properties as a monocrystal though the first semiconductor film is polycrystal.

According to a fifth aspect of the present invention, there is provided a thin film semiconductor device which has at least two semiconductor device portions on an insulating substrate, a second semiconductor layer and an insulating film layer selectively formed on a partial region of the insulating substrate, the laminate consisting of the second semiconductor layer and the insulating film layer being in contact with a first semiconductor layer, the second semiconductor layer being not existent between a first semiconductor device and a second semiconductor device, a gate electrode formed on the first semiconductor layer through a gate insulating film, first charge transmitting and receiving means and second charge transmitting and receiving means formed on the first semiconductor film at a predetermined interval therebetween, and a channel region formed between the first and second charge transmitting and receiving means. Also in this thin film semiconductor device, the main orientation of the first semiconductor film constituting the channel region is more preferably {110} with respect to the main surface of the insulating non-crystalline substrate or the gate insulating film.

This thin film semiconductor device has the second semiconductor layer below a desired semiconductor device portion and the semiconductor device portion has the first aspect of the present invention. Further, in the present invention, the second semiconductor layer may be existent below the desired semiconductor device portion and the semiconductor device portion may have any one of the second to fourth aspects of the present invention. It is needless to say that the present invention can be carried out using any one of the semiconductor device portions disclosed in this specification.

According to a sixth aspect of the present invention, there is provided a thin film semiconductor device which has at least two semiconductor device portions on an insulating substrate, a second thin film which is selectively formed on a first thin film having a first heat conductivity and which has a second heat conductivity higher than the first heat conductivity, the second thin film being not in contact with a semiconductor layer and arranged between a first semiconductor device portion and a second semiconductor device portion, and the semiconductor device portions being the thin film semiconductor device of any one of the first to fourth aspects of the present invention.

According to a seventh aspect of the present invention, there is provided a thin film semiconductor device which has at least two semiconductor device portions on an insulating substrate, a second thin film which is selectively formed on a first thin film having a first heat conductivity and which has a second heat conductivity lower than the first heat conductivity, the second thin film being in contact with a semiconductor layer and not arranged between a first semiconductor device portion and a second semiconductor device portion, and the semiconductor device portions being the thin film semiconductor device of any one of the first to fourth aspects.

Practical variations of the thin film semiconductor device of the present invention will be described hereinafter.

A semiconductor film production process according to the major aspects of the present invention will be described hereinbelow. A polycrystailline semiconductor film of interest can be obtained by using the following process.

According to an eighth aspect of the present invention, there is provided a process for producing a polycrystalline semiconductor film by carrying out separately the step of growing crystal nuclei in a semiconductor layer formed on an insulating substrate and the step of melt recrystallizing a semiconductor thin film by irradiating a laser beam to grow crystal grains.

According to a ninth aspect of the present invention, there is provided a process for producing a polycrystalline semiconductor film, wherein a non-crystalline semiconductor film formed on the insulating substrate is melt recrystallized by irradiating a laser beam to grow crystal grains.

According to a tenth aspect of the present invention, there is provided a process for producing a polycrystalline semiconductor film, wherein the wavelength of the laser beam is selected from a range of 240 nm to 600 nm and the absorption coefficient for the wavelength of the non-crystalline semiconductor film is larger than the absorption coefficient of the polycrystalline semiconductor film.

According to an eleventh aspect of the present invention, there is provided a process for producing a polycrystalline semiconductor film, wherein the crystal nuclei of the polycrystalline silicon film formed on the insulating film are formed by melt recrystallization by the irradiation of a laser beam.

The crystal nuclei of the polycrystalline silicon film on the insulating substrate are preferably grown by catalytic chemical vapor deposition.

The production apparatus of the present invention comprises means for modulating the pulse width of a laser beam, the time-dependent shape of laser beam intensity and the interval of laser beam pulses, means for shaping the irradiation range of the profile of the laser beam irradiated from an oscillation source to a predetermined form and focusing it on an object to be irradiated, and means of moving the insulating substrate at a predetermined speed and pitch in synchronism with the irradiation of the laser beam.

In the present invention, the charge transmitting and receiving means generally means a source or drain region.

DETAILED DESCRIPTION OF THE EMBODIMENTS

Figure 1A:
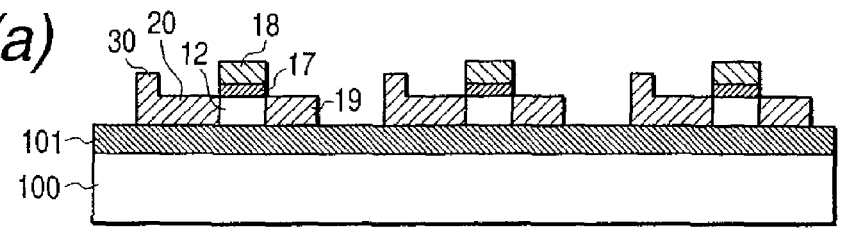
FIGS. 1(a) to 1(c) are diagrams of a semiconductor device according to Embodiment 1 of the preset invention.

Prior to the explanation of preferred embodiments of the present invention, a complementary explanation related to a typical embodiment of the present invention will be given.

To attain the first and second objects of the present invention, the following means is useful.

A region thicker than the channel region is formed in part of a drain or source region constituting a semiconductor layer. Thereby, an extremely useful polycrystalline semiconductor film can be obtained.

Further, the above objects can be easily attained by the following means.

The pulse width of the above laser beam is 100 ns to 1 ms and the energy density is 200 $mJ/cm^2$ to 10 $J/cm^2$. The intensity distribution of the laser beam has such a distribution pattern that intensity is uniform in the width of the beam, or monotonously increases or decreases from one direction to the other.

Further, the above third object can be attained by an MIS type field effect transistor having a gate electrode formed on a first semiconductor layer which is a polycrystalline semiconductor film formed on an insulating substrate through a gate insulating film, a channel region formed on the semiconductor layer and a source region and a drain region formed on both sides of the channel region, wherein a semiconductor layer which is a polycrystalline semiconductor film used in the channel of a semiconductor in which the main orientation of crystal grains constituting the channel region with respect to the surface of the substrate or the gate insulating film is {110} and the main orientation of the surface perpendicular to a direction for connecting the source and drain regions is {100}.

Further, the above objects can be easily attained by applying the following features to a polycrystalline semiconductor film.

The first feature is that a small inclination angle grain boundary having an angle of 75° or less is located between the source and drain regions of the channel region.

The second feature is that the surface roughness of the channel region is smaller than 20 nm and the internal tensile stress of the channel region is $10^9$ $dyn/cm^2$ or more.

The third feature is that the density of metal elements contained in the semiconductor layer is $10^{19}$ $cm^{-3}$ or less and the density of crystal defects contained in the channel region is $10^{17}$ $cm^{-3}$ or less.

A preferred example of the thin film semiconductor device of the present invention is a thin film semiconductor device which has a low-melting point glass substrate as the above insulating substrate. The insulating substrate is typified by a non-crystalline substrate such as a glass substrate, particularly a low-melting point glass substrate.

The present invention provides the following thin film semiconductor devices:

(1) A thin film semiconductor device which has an undulation with a height of 10 nm or more on the surface of the insulating substrate in contact with the semiconductor layer. The insulating substrate such as a glass substrate has an undulation with a height of 10 nm or more.

(2) A thin film semiconductor device which has a thick region thicker than the channel region in part of the above charge transmitting and receiving means constituting the above semiconductor layer, that is, the drain region or the source region.

(3) A thin film semiconductor device which has at least one projection having a width of 5 μm or less and a projection length of 5 μm or less at the periphery of the same plane as the semiconductor layer.

In the thin film semiconductor device of the present invention, the grain size of the semiconductor crystals of the channel region may be larger than the grain size of the crystal grains of the charge transmitting and receiving means, that is, source and drain regions.

The present invention also provides the following polycrystalline semiconductor thin film production processes:

(4) A process for producing a polycrystalline semiconductor thin film wherein the pulse width of an irradiation laser beam is 100 ns to 1 ms.

(5) A process and apparatus for producing a polycrystalline semiconductor thin film by irradiating a non-crystalline or polycrystalline semiconductor thin film formed on an insulating substrate with a laser beam to melt and recrystallize the semiconductor thin film, which comprises means of modulating the pulse width, the time-dependent shape and interval of the laser beam, means of shaping the irradiation range of the profile of the laser beam from an oscillation source to a predetermined form by an optical system consisting of a plurality of lenses and focusing it on the semiconductor thin film, and means of moving the insulating substrate at a predetermined speed and pitch in synchronism with the irradiation of the laser beam.

(6) A process and apparatus for producing a polycrystalline semiconductor thin film described in (5), which has means of moving the insulating substrate or the optical system at a predetermined speed and interval in synchronism with the irradiation of the laser beam and detecting an alignment pattern on the insulating substrate at the same time and means of aligning the laser beam with the substrate by an interferometer.

(7) A process and apparatus for producing a polycrystalline semiconductor thin film described in (5) or (6), wherein the pulse width of the laser beam is 100 ns to 1 ms, the energy density is 200 mJ/cm$^2$ to 10 J/cm$^2$, and the rise time, fall time, pulse width and pulse interval of the laser beam are controlled by polarization with an EO modulator according to an external voltage.

(8) A process and apparatus for producing a polycrystalline semiconductor thin film, wherein the intensity distribution of the laser beam has such a distribution pattern that the intensity in the width of a beam is uniform or monotonously increases or decreases from one direction to the other.

(9) A laser used for the production of the polycrystalline semiconductor thin film of the present invention is preferably a solid-state laser or laser diode.

(10) A process and apparatus for producing a polycrystalline semiconductor thin films wherein the intensity distribution of the laser beam has an intensity gradient of optical energy in a direction parallel to the source and drain direction.

A thin film semiconductor device, production process and production apparatus according to preferred embodiments of the present invention will be described hereinafter with reference to the accompanying drawings.

Embodiment 1

Figure 1B:
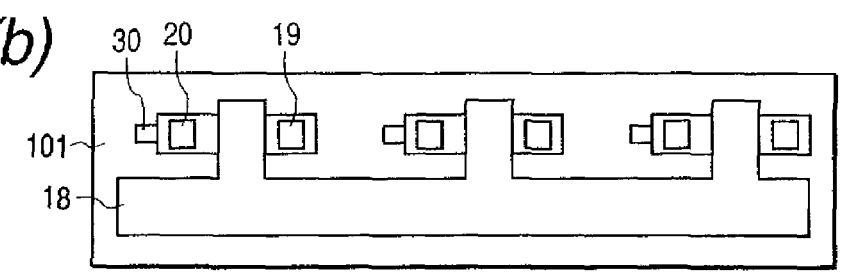
Figure 1C:
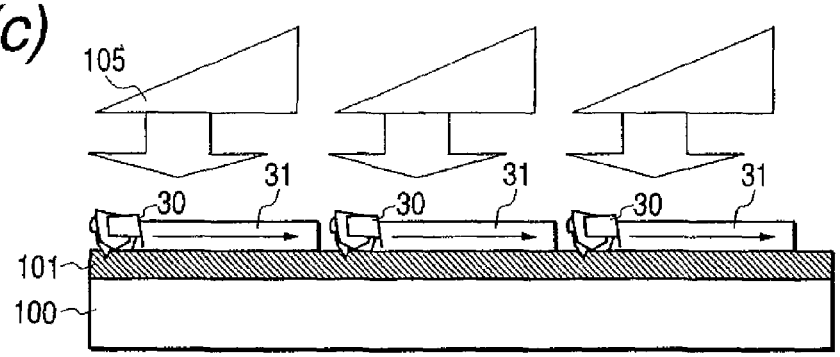

FIGS. 1(a) to 1(c) are diagrams for explaining a thin film semiconductor device according to Embodiment 1 of the present invention. FIGS. 1(a) to 1(c) show the thin film semiconductor device having three polycrystalline silicon thin film transistors. FIG. 1(a) is a sectional view and FIG. 1(b) is a plan view of the thin film semiconductor device. In FIG. 1(a) and FIG. 1(b), reference numeral 100 denotes an insulating substrate, 101 underlying layer film, 18 gate electrode and 17 gate insulating film. A glass substrate is frequently used as the insulating substrate. A silicon dioxide (SiO$_2$) film is generally used as the above underlying layer film.

Each silicon semiconductor layer comprises a channel region 12, a source region 20, a drain region 19 and a projecting crystal nucleus region 30. The channel region 12 is composed of a polycrystalline silicon film having a large grain size and the crystal nucleus region 30 is generally composed of a polycrystalline silicon film having a small grain size.

In this embodiment, as seen in the plan view of FIG. 1(b), the gate electrodes 18 are connected to one another. As a matter of course, the gate electrode may be formed independently.

The channel region 12 having a large grain size is obtained by a crystallization method as shown in FIG. 1(c). An amorphous silicon film or polycrystalline silicon film is irradiated with an inclined linear laser beam having an intensity distribution as shown in FIG. 1(c). Reference numeral 105 in FIG. 1(c) denotes a typical inclined intensity distribution of this laser light. The pulse width of the laser light is desirably selected from a range of 100 ns to 1 ms. The optimum laser conditions for obtaining a silicon semiconductor layer film having a thickness of 300 nm or less and a grain size of for example 5 μm which is larger than the length of the channel are a pulse width of 10 ms and a power of 1 w. When a laser beam is irradiated under the above conditions, crystallization starts from the crystal nucleus region 30 where the silicon film is thicker than the silicon film therearound. That is, crystal growth begins from a low-temperature region. Crystals grow in a direction shown by arrows in FIG. 1(c) and a polycrystalline silicon film 31 having a larger grain size than the channel region is formed.

FIGS. 3(a) to 3(e) are sectional views showing the production process of the thin film semiconductor device of this embodiment. A base layer which is a silicon dioxide film 101 and an amorphous or polycrystalline silicon film 110 are formed on a non-crystalline substrate 100 made from glass or the like (FIG. 3(a)). This amorphous silicon film or polycrystalline silicon film 110 is processed into three regions by etching using a general photoresist. At this point, the crystal nucleus region 30 is formed (FIG. 3(b)). The thus prepared substrate is irradiated with laser light having the above-mentioned inclined luminous or light intensity (FIG. 3(c)). In this case, laser light is adjusted to have inclined luminous intensity according to the region of each semiconductor device. After the semiconductor thin film is melt and recrystallized, the gate insulating film 17 and the gate electrode 18 are formed (FIG. 3(d)). A source and drain are formed by general ion implantation. Impurities such as phosphorus and boron are frequently used (FIG. 3(e)).

In this embodiment, after the polycrystalline silicon film including the crystal nucleus region 30 is formed on the insulating substrate, the step of melt recrystallizing the semiconductor thin film by the irradiation of a laser beam to grow grains from the above crystal nuclei can be carried out separately. The wavelength of a laser beam suitable to selectively grow crystal grains efficiently is desirably selected from a range of 240 to 600 nm. The reason for this is that the absorption coefficient of the amorphous silicon film at a wavelength of 500 nm is about 5 times larger than the absorption coefficient of the polycrystalline silicon film. Therefore, it is easy to selectively melt recrystallize other semiconductor layer regions with crystal nuclei composed of a polycrystalline silicon film as a seed. Meanwhile, the crystal nucleus region composed of a polycrystalline silicon film having a small grain size on the insulating substrate can be formed by melt recrystallization with the irradiation of a general excimer pulse laser beam.

Figure 2A:
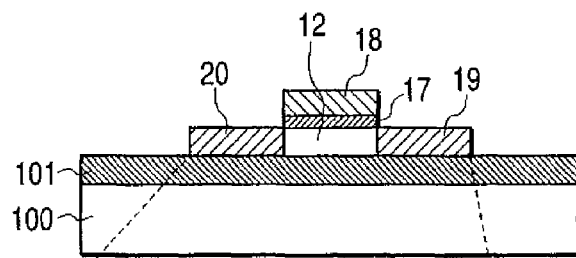
FIGS. 2(a)-2(b) are diagrams for explaining the semiconductor device according to Embodiment 1 of the present invention.
Figure 2B:
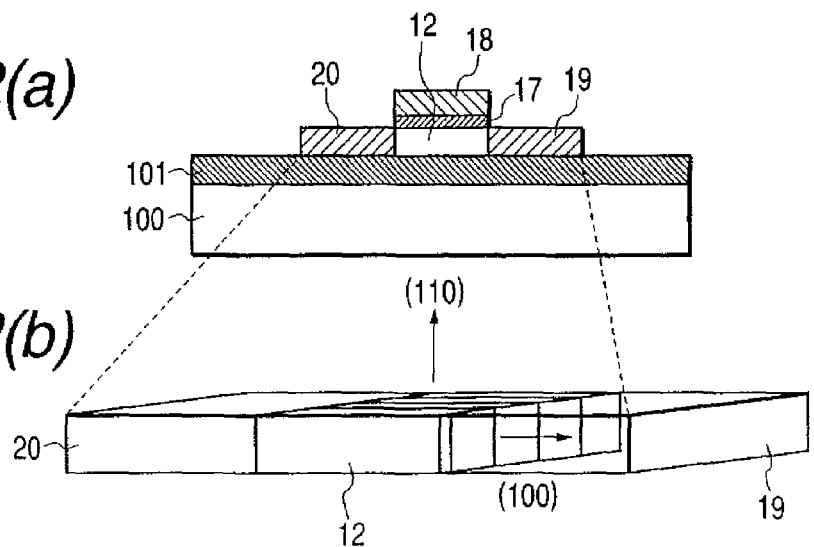
Figure 3A:
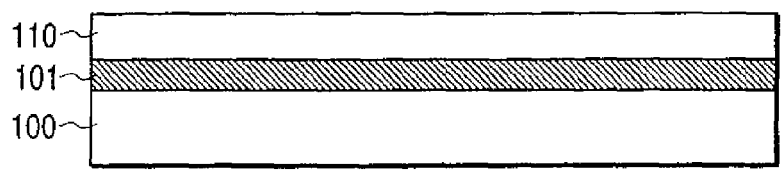
FIGS. 3(a) to 3(e) are sectional views for explaining a semiconductor device production process according to the present invention in the order of production steps.
Figure 3B:
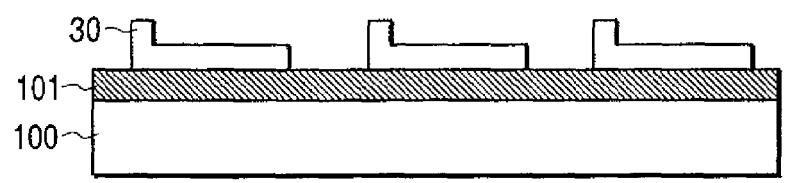
Figure 3C:
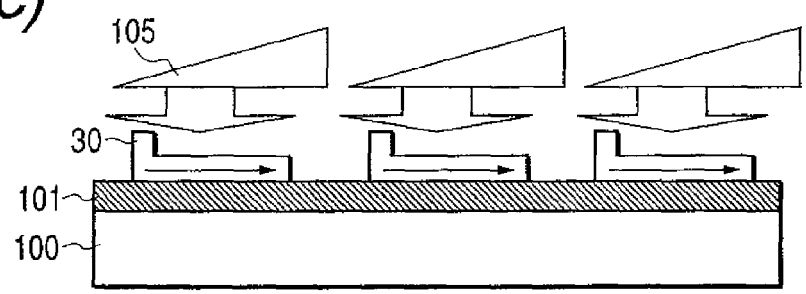
Figure 3D:
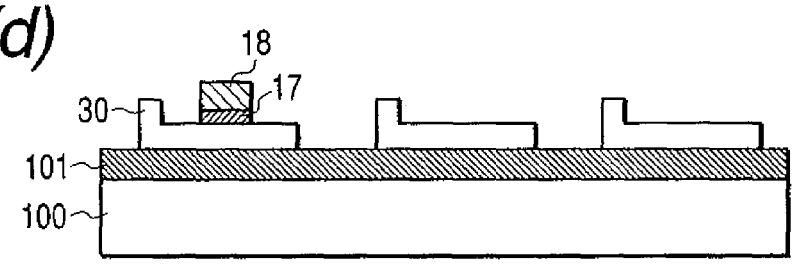
Figure 3E:
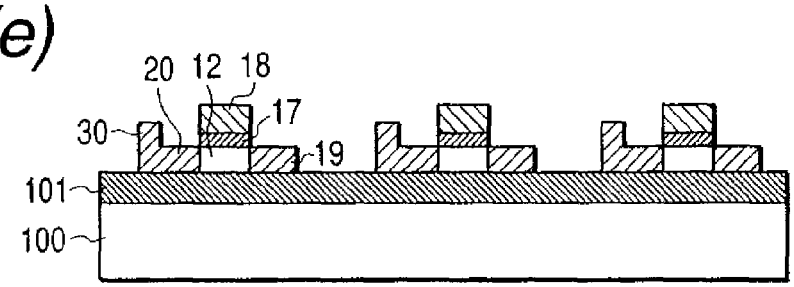

FIGS. 2(a) and 2(b) schematically show the crystalline state of the semiconductor layer, particularly the channel region. FIG. 2(a) is a sectional view of one transistor portion and FIG. 2(b) is a perspective view of the semiconductor layer. The corresponding region in FIG. 2(a) and FIG. 2(b) is shown by dotted lines. FIGS. 2(c)-2(e) schematically show the state of the crystalline shape, particularly the channel region of the transistor portion shown in FIGS. 2(a) and 2(b). Specifically, FIGS. 2(c), 2(d) and 2(e) are a further representation related to FIGS. 2(a)-2(b) for purposes of showing a more detailed view of the crystallization structure in which FIG. 2(c) is a perspective view, FIG. 2(d) is a planar cross-sectional view and FIG. 2(e) is a side cross-sectional view related to the channel region 12 thereof, respectively. The same reference numerals denote the same elements as in FIGS. 1(a) to 1(c). This embodiment is the most preferred embodiment of the present invention.

The main orientation of a polycrystalline substance at least in the channel region 12 is {110} with respect to the surface of the gate insulating film and the substrate. The polycrystalline substance is a polycrystalline silicon film having a main orientation of the surface almost perpendicular to a direction for connecting the source region 20 and the drain region 19 such as of {100}. A small inclination angle grain boundary having a rotation angle of 70° or less is located between a plurality of crystal grains constituting the channel region 12.

Further, the surface roughness of the channel region 12 is smaller than 20 nm, the internal tensile stress is $10^9$ dyn/cm$^2$ or more, and the density of the contained crystal defects is $10^{17}$ cm$^{-3}$ or less. The density of metal elements contained in the whole semiconductor layer including the channel region 12 is $10^{19}$ cm$^{-3}$ or less.

Figure 4:
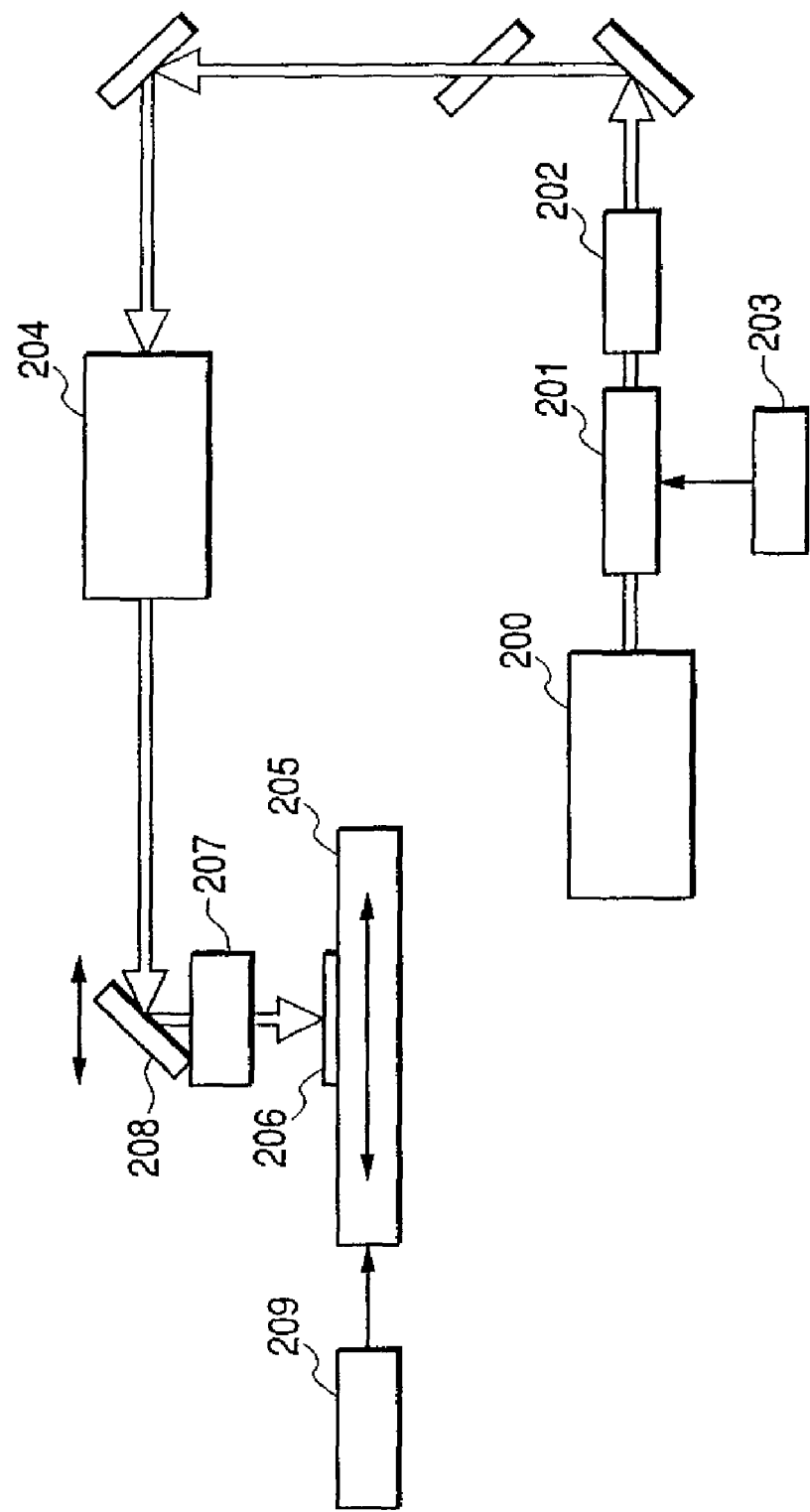
FIG. 4 is a conceptual diagram of the production apparatus of the present invention.

FIG. 4 shows an example of production apparatus used in the embodiment of the present invention. This apparatus is suitable for the formation of a polycrystalline semiconductor film by melt recrystallizing a semiconductor thin film by irradiating the non-crystalline or polycrystalline semiconductor thin film formed on the insulating substrate 205 shown in FIGS. 2(a) and 2(b) with a laser beam. This apparatus has a CW (continuous wave) laser unit 200, means of modulating the pulse width, time-dependent shape and interval of the laser beam (201, 202, 203), optical system for focusing a laser beam from an oscillation source and moving means capable of moving the laser beam relative to an object to be irradiated. The modulation means has an EO modulator 201, polarizing plate 202 and driver 203. The optical system comprises a beam shaping unit 204 for shaping the profile of the laser beam irradiated from the oscillation source to an appropriate form by means of an optical system consisting of a plurality of lenses or diffraction optical element, a mirror 208 having a scanning function and focusing lens system 207 for focusing the laser beam. The moving means is capable of moving the insulating substrate 205 at a predetermined pitch in synchronism with the irradiation of the laser beam.

Figure 5A:
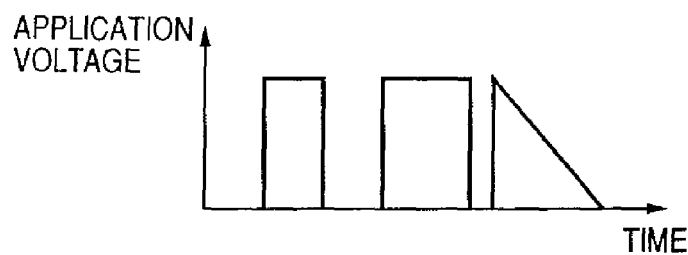
FIGS. 5(a) and 5(b) are diagrams showing time changes of laser beam intensity.
Figure 5B:
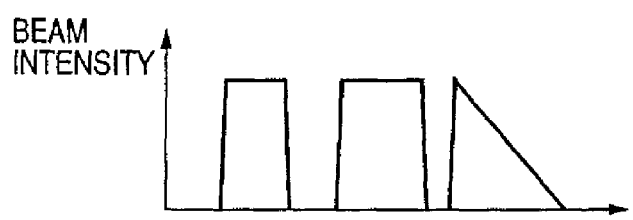

The pulse width, time-dependent shape and pulse interval of the laser beam are shown in FIG. 5(a) and FIG. 5(b). FIG. 5(a) shows the waveform of voltage applied to the EO modulator 201 and FIG. 5(b) shows the waveform of beam intensity through a polarizer. The rise time, pulse width, fall time and pulse interval of beam intensity can be controlled by voltage from the outside. FIGS. 5(a) and 5(b) show two pulses having different widths and an inclined pulse to be controlled.

Figure 6A:
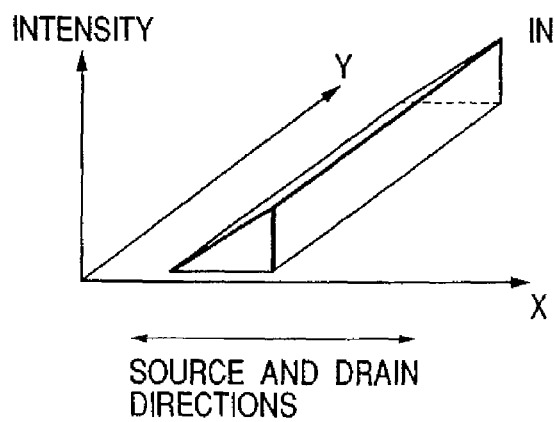
FIGS. 6(a) and 6(b) are diagrams showing examples of spatial distribution of laser beam intensity.
Figure 6B:
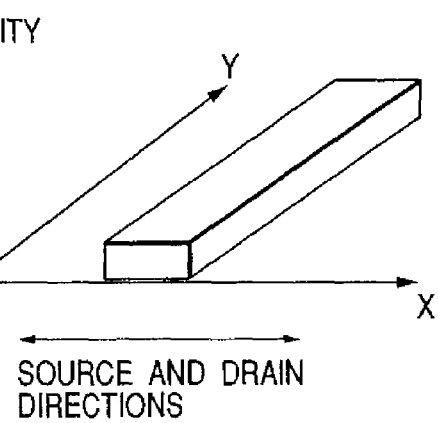

FIG. 6(a) and FIG. 6(b) show the shapes of laser beams. These perspective views show the shapes of a laser beam which has been shaped to a desired form by the beam shaping unit 204 and focused on a sample by the focusing lens. FIG. 6(a) shows a distribution pattern that intensity monotonously increases from one direction to the other and FIG. 6(b) shows uniform intensity in the width of a beam. When the thin film semiconductor device of the present invention is to be produced, if the width direction of the laser beam and the intensity distribution of the laser beam are parallel to the source and drain directions, large crystal grains are obtained efficiently.

By moving the insulating substrate 206 or the mirror 208 at a predetermined speed and interval in synchronism with the irradiation of the laser beam, a desired region can be crystallized.

In the present invention, the alignment pattern on the insulating substrate can be detected by a level difference of the semiconductor layer film or a level difference in the crystal nucleus region 30 in FIGS. 1(a) to 1(c). Stated more specifically, the laser beam can be aligned with the substrate by an interferometer.

According to this embodiment, a high-quality polycrystalline semiconductor film whose grain boundary, grain size and crystallization direction can be controlled and whose film roughness and crystal defects formed by crystallization have been reduced can be formed on the insulating substrate made from glass or the like. According to this embodiment, a production process and apparatus for forming a low-cost and high-quality polycrystalline semiconductor film, which can reduce the number of production steps, can be applied to a large-area substrate, and have a high throughput are realized.

Further, when the polycrystalline semiconductor film shown in this embodiment is used in a MIS type field effect transistor, the field effect mobility can be controlled to about 300 cm$^2$/V·s or more and variations in threshold voltage can be suppressed to ±0.2 V or less. Thus, according to the present invention, a thin film semiconductor device which operates with high performance and high reliability and has excellent uniformity among devices can be obtained.

In this embodiment, a polycrystalline silicon film is used as a semiconductor film before the irradiation of a laser beam. When an amorphous silicon film is used, the same effect is obtained. In this embodiment, an inclined laser beam is used. When a uniform beam is used, the same effect is obtained. Further, in this embodiment, crystals are grown with the crystal nucleus region 30 as a starting point. By optimizing the shape of a laser beam, the same effect is obtained in a structure containing no crystal nuclei 30 on the projection. In this case, the initial semiconductor film is a polycrystalline silicon film containing crystal nuclei and can be obtained by melt recrystallization by the irradiation of an excimer laser beam. The same effect is obtained when the above polycrystalline silicon film is formed at a low temperature by CAT-CVD (Catalytic-Chemical Vapor Deposition).

Embodiment 2

Figure 7A:
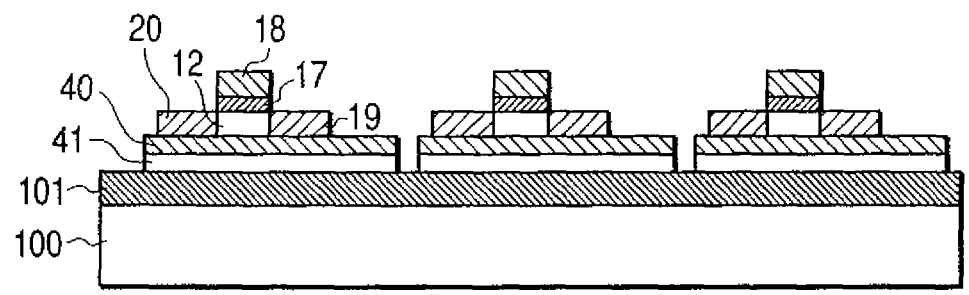
FIGS. 7(a) to 7(c) are diagrams for explaining a semiconductor device according to Embodiment 2 of the present invention.
Figure 7B:
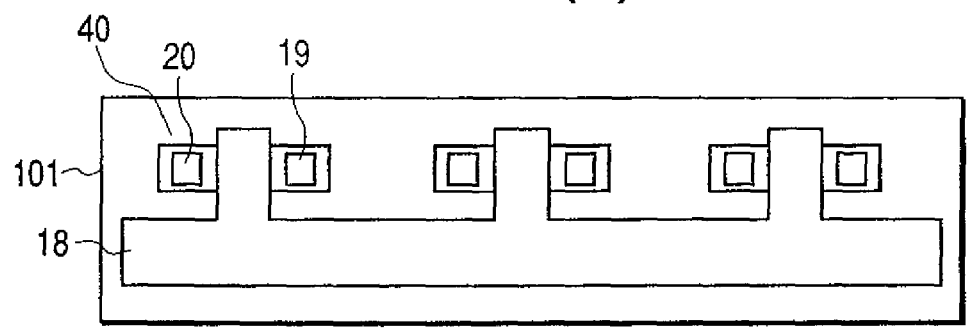
Figure 7C:
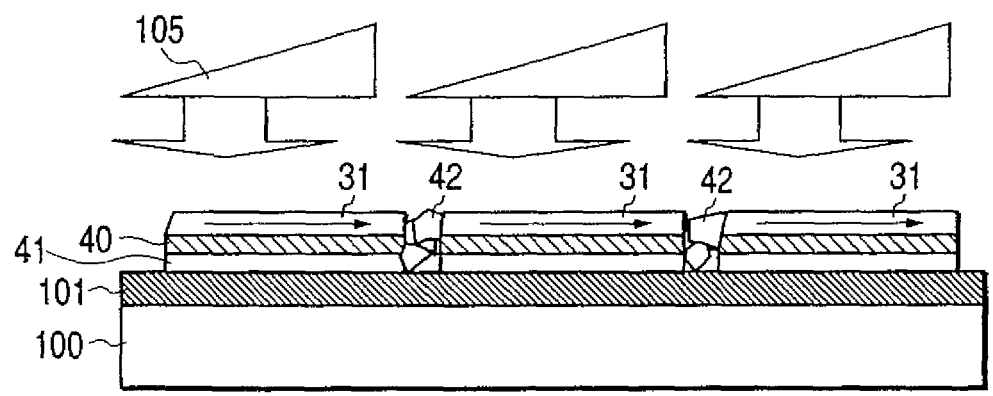
Figure 8A:
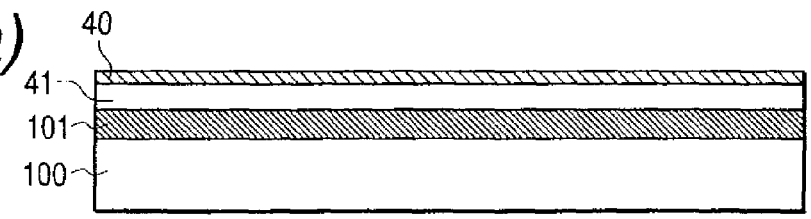
FIGS. 8(a) to 8(f) are sectional views for explaining a semiconductor device production process according to the present invention in the order of production steps.
Figure 8B:
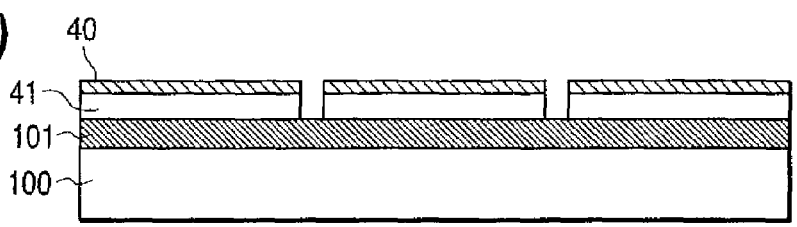
Figure 8C:
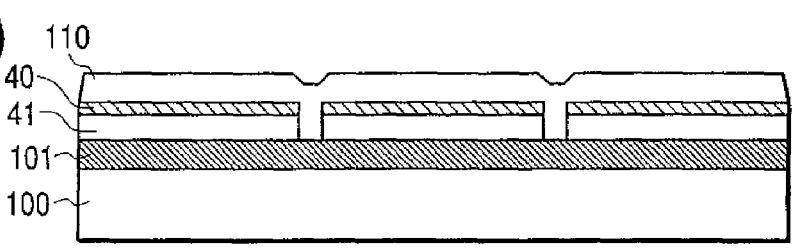
Figure 8D:
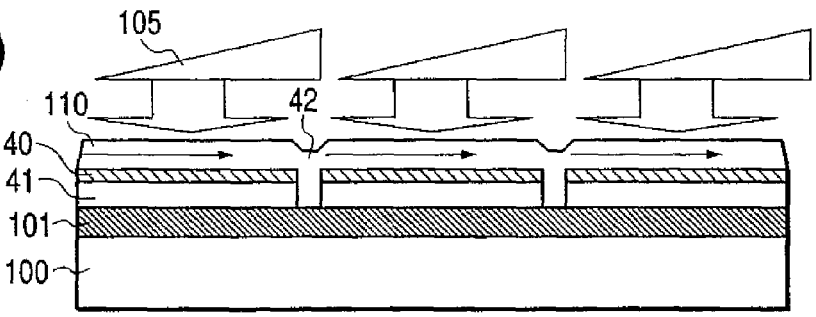
Figure 8E:
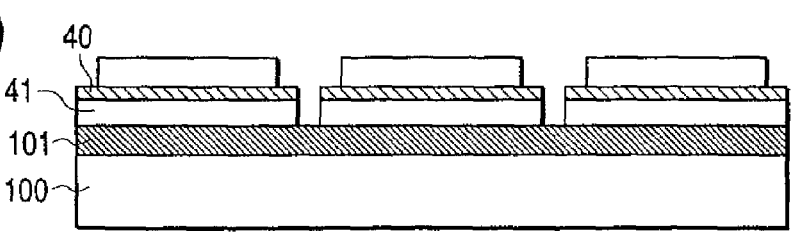
Figure 8F:
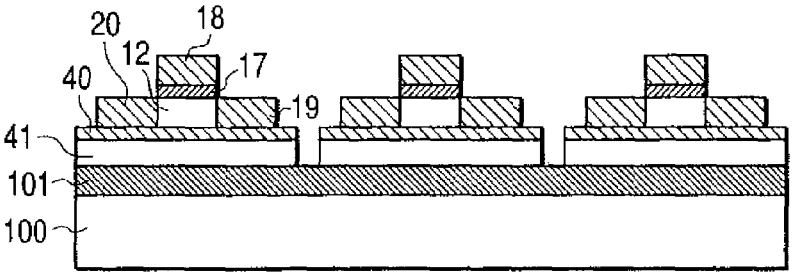

FIGS. 7(a) to 7(c) are diagrams for explaining a semiconductor device according to Embodiment 2 of the present invention. In this embodiment, a second semiconductor layer is formed below the semiconductor layer constituting a channel from the viewpoint of crystal growth. FIGS. 7(a) to 7(c) show three polycrystalline silicon thin film transistors mounted. FIG. 7(a) is a sectional view and FIG. 7(b) is a plan view of the semiconductor device. FIG. 7(c) is a sectional view for explaining a laser beam irradiation method.

In FIG. 7(a) and FIG. 7(b), reference numeral 100 denotes an insulating substrate, 101 underlying layer film, 18 gate electrode and 17 gate insulating film. A glass substrate is frequently used as the insulating substrate. A silicon dioxide film is generally used as the underlying layer film.

The first semiconductor layer has a channel region 12, source region 20 and drain region 19. The channel region 12 is composed of a polycrystalline silicon film having a large grain size. A second semiconductor layer 41 is selectively inserted between the silicon semiconductor layer and the underlying layer film 101 with an insulating film 40. The second semiconductor layer 41 is not formed in a region between a plurality of semiconductor devices.

FIGS. 8(a) to 8(f) are sectional views showing a process for producing the thin film semiconductor device of this embodiment. A base layer which is the silicon dioxide film 101, an amorphous silicon layer which is the second semiconductor layer 41 and a silicon dioxide layer 40 are formed on a non-crystalline substrate 100 made from glass or the like (FIG. 8(a)). The above layers 40 and 41 are processed into three regions of predetermined thin film semiconductor devices by etching (FIG. 8(b)). An amorphous silicon film or polycrystalline silicon film 110 is formed on the above layers (FIG. 8(c)). The thus prepared substrate is irradiated with laser light 105 having the above-mentioned inclined luminous intensity (FIG. 8(d)). In this case, laser light is adjusted to have inclined luminous intensity according to the region of each semiconductor device. In this embodiment, a region devoid of the second semiconductor film 40 is a crystal nucleus region. After the first semiconductor thin film is melt recrystallized, it is processed to a desired shape (FIG. 8(e)). The gate insulating film 17 and the gate electrode 18 are formed on the first semiconductor thin film. A source and a drain are formed by a commonly used method (FIG. 8(f)).

The channel region 12 having a large grain size is obtained by a crystallization method shown in FIG. 7(c). The amorphous silicon film or polycrystalline silicon film is irradiated with an inclined linear laser beam having an intensity distribution shown in FIG. 7(c). The pulse width of the laser is desirably selected from a range of 100 ns to 1 ms. The optimum laser conditions for obtaining a silicon semiconductor layer film having thickness of 100 nm or less and a grain size of 5 μm which is larger than the length of the channel are a pulse width of 10 ms and a power of 1 w.

When the laser beam is irradiated under the above conditions, crystallization starts from a region devoid of the second silicon semiconductor layer below the silicon semiconductor layer. The reason for this is that the laser beam passing through the first silicon semiconductor film reaches the second silicon semiconductor film when the laser beam is irradiated. The laser beam is absorbed in the second silicon semiconductor film and the temperature of the semiconductor layer rises. This temperature rise functions as a heat sink to suppress quenching. In a region where this heat sink is not formed in the layer underlying the first silicon semiconductor layer, the temperature is low and the crystallization start time is early. Therefore, crystallization starts from the region devoid of the second semiconductor layer below the first silicon semiconductor layer and the region becomes the crystal nucleus region 42. The wavelength of a laser beam suitable for selectively growing crystal grains at a high efficiency is desirably selected from a range of 240 to 600 nm. In this embodiment, after a polycrystalline silicon film including the crystal nucleus region 30 is formed on the insulating substrate, the step of melt recrystallizing the semiconductor thin film by the irradiation of a laser beam to grow grains from the crystal nuclei can be carried out separately. The crystal nucleus region composed of a polycrystalline silicon film having a small grain size on the insulating substrate can be formed by melt recrystallization with the irradiation of a laser beam from an excimer pulse laser of the prior art.

FIGS. 2(a)-2(e) show the crystal state of the semiconductor layer, particularly the channel region. From FIGS. 2(c)-2(e) the channel region which has a large grain size contains substantially a belt-shaping crystal type configuration. This is depicted by reference numeral 400 in FIGS. 2(c)-2(e). The semiconductor layer is composed of a polycrystalline silicon film in which at least the main orientation of the channel region is {110} with respect to the surface of the gate insulating film and the main orientation of the surface almost perpendicular to a direction for connecting the above source region 20 and the drain region 19 is {100}. A small inclination angle grain boundary having a rotation angle of 75° or less is formed between a plurality of crystal grains constituting the channel region 12. Further, the surface roughness of the channel region 12 is smaller than 20 nm, the internal tensile stress thereof is $10^9$ dyn/cm$^2$ or more, and the density of crystal defects contained therein is $10^{17}$ cm$^{-3}$ or less. The density of metal elements contained in the whole semiconductor layer including the channel region 12 is 1019 cm-3 or less.

When the production process and apparatus for forming a polycrystalline semiconductor film by melt recrystallizing a semiconductor thin film shown in FIG. 4 of Embodiment 1 are used, the same effect is obtained. In this embodiment, the alignment pattern on the insulating substrate can be detected by a level difference between the second semiconductor layer film 41 and the insulating film 40 or a level difference in the crystal nucleus region 42 in FIG. 8.

According to this embodiment, a high-quality polycrystalline semiconductor film whose grain boundary, grain size and crystal orientation can be controlled and whose film roughness and crystal defects formed by crystallization have been reduced can be formed on the insulating substrate made from glass or the like. According to this embodiment, a production process and apparatus for forming a low-cost and high-quality polycrystalline semiconductor film, which can reduce the number of production steps, can be applied to a large-area substrate, and have a high throughput are realized. Further, when the polycrystalline semiconductor film shown in this embodiment is used in an MIS type field effect transistor, the field effect mobility can be controlled to be about 300 cm$^2$/V·s or more and variations in threshold voltage can be suppressed to ±0.2 V or less. According to this embodiment, a semiconductor device which operates with high performance and high reliability and is excellent in uniformity among devices can be obtained.

Embodiment 3

Figure 9A:
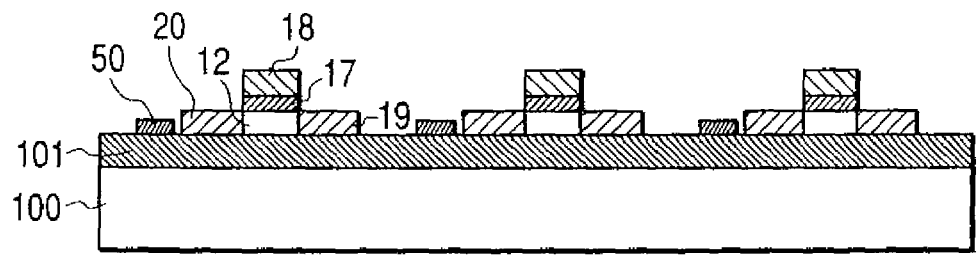
FIGS. 9(a) to 9(c) are diagrams for explaining a semiconductor device according to Embodiment 3 of the present invention.
Figure 9B:
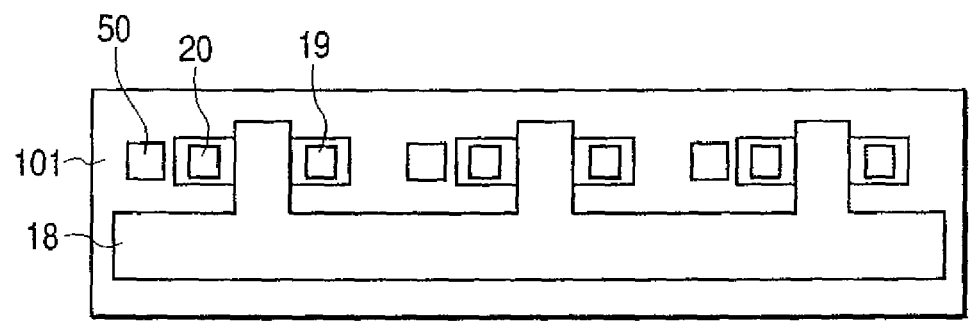
Figure 9C:
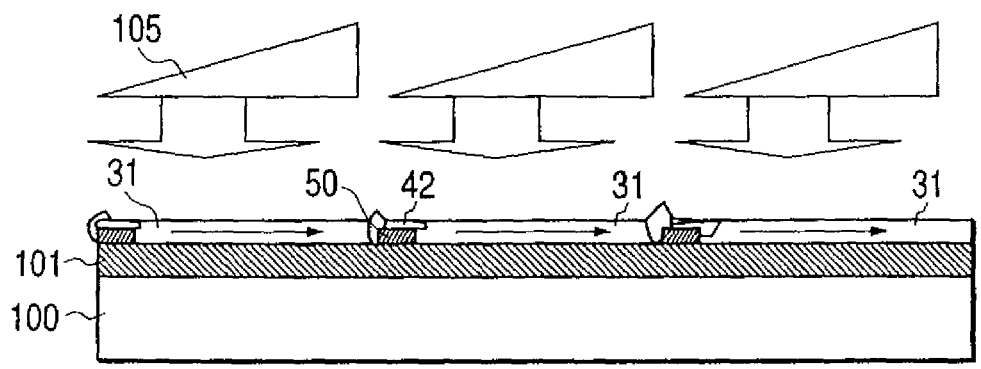
Figure 10A:
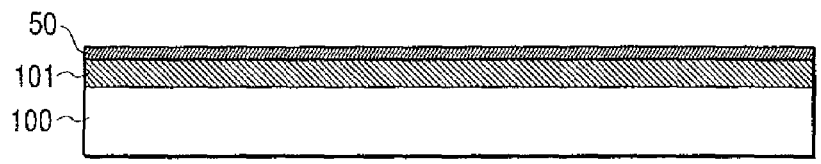
FIGS. 10(a) to 10(e) are sectional views for explaining a semiconductor device production process according to the present invention in the order of production steps.
Figure 10B:
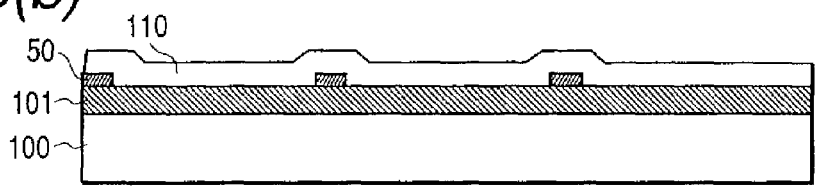
Figure 10C:
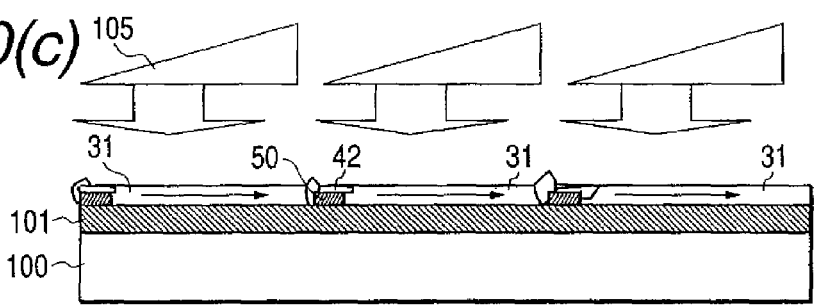
Figure 10D:
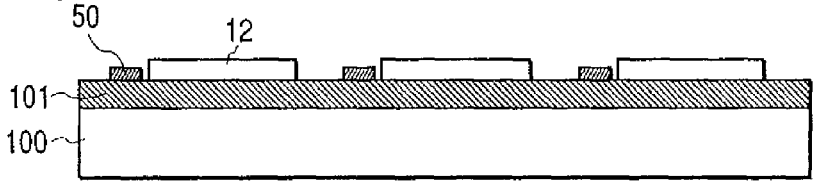
Figure 10E:
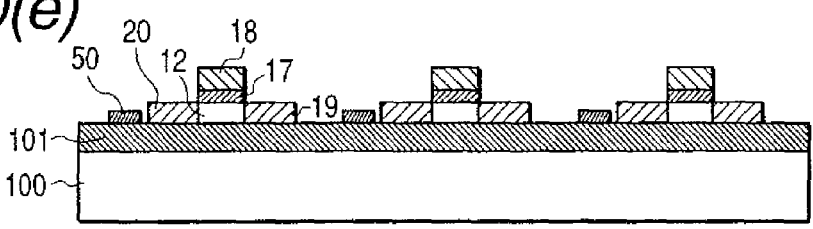

FIGS. 9(a) to 9(c) are diagrams for explaining a semiconductor device according to Embodiment 3 of the present invention. In this embodiment, a member which facilitates the partial radiation of heat during crystal growth is used.

FIGS. 9(a) to 9(c) show a semiconductor device having three polycrystalline silicon thin film transistors formed thereon. FIG. 9(a) is a sectional view and FIG. 9(b) is a plan view of the semiconductor device.

In FIGS. 9(a) and 9(b), reference numeral 100 denotes an insulating substrate, 101 underlying layer film, 19 gate electrode and 17 gate insulating film. The semiconductor layer is composed of a channel region 12, source region 20 and drain region 19, and the channel region 12 is composed of a polycrystalline silicon film having a large grain size. An insulating film 50 is selectively formed on the underlying layer film 101 between a plurality of semiconductor devices. The heat conductivity of the insulating film 50 is higher than the heat conductivity of the underlying layer film 101 and the insulating substrate 100.

FIGS. 10(a) to 10(e) are sectional views showing the production process of the thin film semiconductor device of this embodiment. A base layer which is a silicon dioxide film 101 and a $Si_3N_4$ layer as the insulating film 50 having a higher heat conductivity than the underlying layer film 101 are formed on the non-crystalline substrate 100 made from glass or the like (FIG. 10(a)). This insulating film 50 provide is for the area of each thin film semiconductor device. The region where this insulating film 50 is provided is a crystal nucleus region. An amorphous silicon film or polycrystalline silicon film 110 is formed on the thus prepared substrate (FIG. 10(b)). The thus prepared substrate is irradiated with laser light 105 having the above inclined luminous intensity (FIG. 10(c)). In this case, laser light is adjusted to have the above inclined luminous intensity according to the area of each semiconductor device. After the melt recrystallization of the first semiconductor thin film, the first semiconductor thin film is processed to a desired shape (FIG. 10(d)). The gate insulating film 17 and the gate electrode 18 are formed on this first semiconductor thin film. A source and a drain are formed by a general method (FIG. 10(e)).

The channel region 12 having a large grain size is obtained by a crystallization method shown in FIG. 9(c). The amorphous silicon film or polycrystalline silicon film is irradiated with an inclined linear laser beam having an intensity distribution shown in FIG. 9(c). The pulse width of the laser is desirably selected from a range of 100 ns to 1 ms. The optimum laser conditions for obtaining a silicon semiconductor layer film having thickness of 100 nm or less and a grain size of 5 μm which is larger than the length of the channel are a pulse width of 10 μs and a power of 1 w. When a laser beam is irradiated under the above conditions, crystallization starts from the region where the insulating film 50 is formed below the silicon semiconductor layer. The reason for this is that the semiconductor region having the insulating film 50 therebeneath has a larger amount of heat dissipated downward than other semiconductor film regions as the heat conductivity of the insulating film 50 is higher than the heat conductivity of the amorphous silicon film or polycrystalline silicon film 110 with the result that that semiconductor region becomes a crystal nucleus region due to an early reduction in temperature and an early crystallization start time. In this embodiment, after a polycrystalline silicon film including the crystal nucleus region 30 is formed on the insulating substrate, the step of melt recrystallizing the semiconductor thin film by irradiating a laser beam to grow grains from the crystal nuclei can be carried out separately. The crystal nucleus region composed of a polycrystalline silicon film having a small grain size on the insulating substrate can be formed by melt recrystallization by the irradiation of a laser beam from an excimer pulse laser of the prior art. In this embodiment, the insulating film 50 is processed to a rectangular shape. When the insulating film 50 is processed to a linear shape, the same effect is obtained. A silicon nitride film is suitable for use as the insulating film 50.

FIGS. 2(a)-2(c) show the crystal state of the semiconductor layer, particularly the channel region. The semiconductor layer is composed of a polycrystalline silicon film in which at least the main orientation of the channel region is {110} with respect to the surface of the gate insulating film and the main orientation of the surface almost perpendicular to a direction for connecting the above source region 20 and the drain region 19 is {100}. A small inclination angle grain boundary having a rotation angle of 70° or less is formed between a plurality of crystal grains constituting the channel region 12. Further, the surface roughness of the channel region 12 is smaller than 20 nm, the internal tensile stress thereof is $10^9$ $dyn/cm^2$ or more, the density of crystal defects contained therein is $10^{17}$ $cm^{-3}$ or less, and the density of metal elements contained in the whole semiconductor layer including the channel region 12 is $10^{19}$ $cm^{-3}$ or less.

When the production process and apparatus for forming a polycrystalline semiconductor film by melt recrystallizing a semiconductor thin film shown in FIGS. 3(a) to 3(e) of Embodiment 1 are used, the same effect is obtained. In this embodiment, the alignment pattern on the insulating substrate can be detected by the level difference of the insulating film 51 in FIGS. 11(a) to 11(c).

According to this embodiment, a high-quality polycrystalline semiconductor film whose grain boundary, grain size and crystal orientation can be controlled and whose film roughness and crystal defects formed by crystallization have been reduced can be formed on the insulating substrate made from glass or the like. According to this embodiment, a production process and apparatus for forming a low-cost and high-quality polycrystalline semiconductor film, which can reduce the number of production steps, can be applied to a large-area substrate, and have a high throughput are realized. Further, when the polycrystalline semiconductor film of this embodiment is used in an MIS type field effect transistor, the field effect mobility can be controlled to be about 300 $cm^2/V·s$ or more, variations in threshold voltage can be suppressed to ±0.2 V or less, and a semiconductor device which operates with high performance and high reliability and is excellent in uniformity among devices can be obtained.

Embodiment 4

Figure 11A:
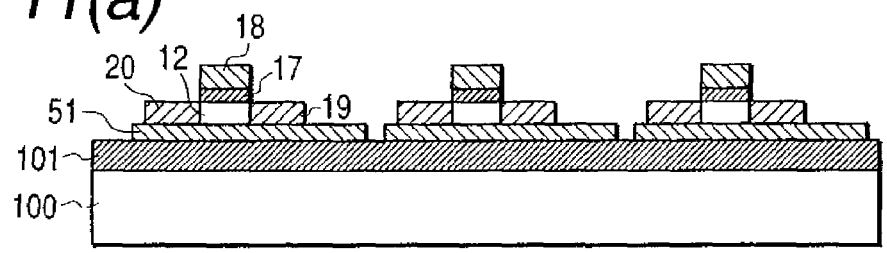
FIGS. 11(a) to 11(c) are diagrams for explaining a semiconductor device according to Embodiment 4 of the present invention.
Figure 11B:
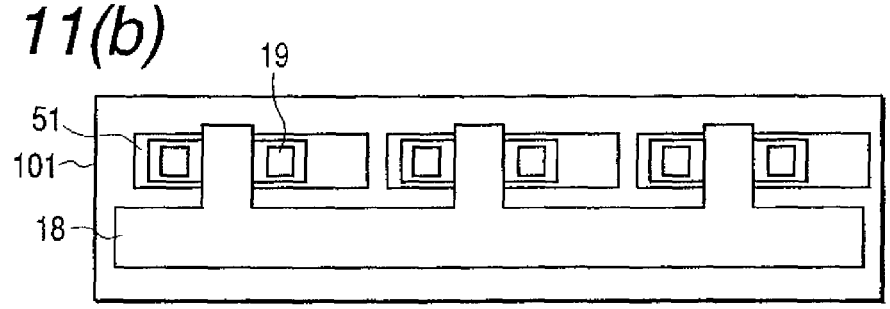
Figure 11C:
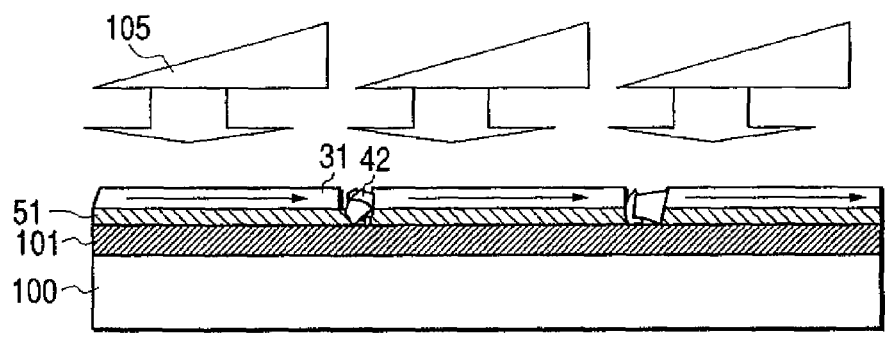
Figure 12:
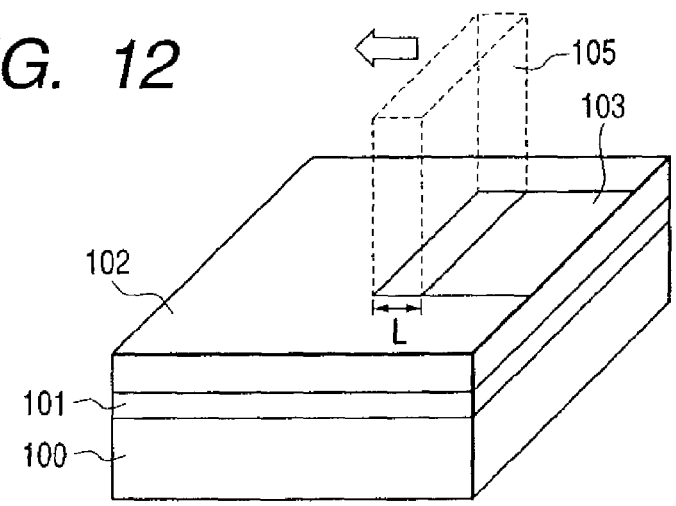
FIG. 12 is a perspective view showing an example of laser beam irradiation of the prior art.

FIGS. 11(a) to 11(c) are diagrams for explaining a semiconductor device according to Embodiment 4 of the present invention. FIG. 11 (a) is a sectional view of a semiconductor device having three polycrystalline silicon thin film transistors formed thereon and FIG. 11(b) is a plan view thereof. In FIGS. 11(a) and 11(b), reference numeral 100 denotes an insulating substrate, 101 underlying layer film, 51 insulating film, 18 gate electrode and 17 gate insulating film. The semiconductor layer comprises a channel region 12, source region 20 and drain region 19, and the channel region 12 is composed of a polycrystalline silicon film having a large grain size. The insulating film 51 is selectively inserted between the silicon semiconductor layer and the underlying layer film 101. The heat conductivity of the insulating film 51 is made lower than the heat conductivity of the amorphous silicon film or polycrystalline silicon film 31.

The channel region 12 having a large grain size is obtained by a crystallization method shown in FIG. 11(*c*). The amorphous silicon film or polycrystalline silicon film is irradiated with an inclined linear laser beam having an intensity distribution shown in FIG. 11(*c*). The pulse width of the laser is desirably selected from a range of 100 ns to 1 ms. The optimum laser conditions for obtaining a silicon semiconductor layer film having thickness of 100 nm or less and a grain size of 5 μm which is larger than the length of the channel are a pulse width of 10 μs and a power of 1 w. When a laser beam is irradiated under the above conditions, crystallization starts from a region where the insulating film 51 is not formed below the silicon semiconductor layer. The reason for this is that the semiconductor region having the insulating film 51 therebeneath has a smaller amount of heat dissipated downward than other semiconductor film regions as the heat conductivity of the insulating film 51 is lower than the heat conductivity of the amorphous silicon film or polycrystalline silicon film 31 with the result that that semiconductor region becomes a crystal nucleus region 42 due to an early reduction in temperature and an early crystallization start time. In this embodiment, after a polycrystalline silicon film including the crystal nucleus region 42 is formed on the insulating substrate, the step of melt recrystallizing the semiconductor thin film by irradiating a laser beam to grow grains from the crystal nuclei can be carried out separately. The crystal nucleus region composed of a polycrystalline silicon film having a small grain size on the insulating substrate can be formed by melt recrystallization by the irradiation of a laser beam from an excimer pulse laser of the prior art. An insulating film having a small density and a small dielectric constant or a porous silicon oxide film is suitable for use as the insulating film 51.

FIGS. 2(*a*) and 2(*b*) show the crystal state of the semiconductor layer, particularly the channel region. The semiconductor layer is composed of a polycrystalline silicon film in which at least the main orientation of the channel region is {110} with respect to the surface of the gate insulating film and the main orientation of the surface almost perpendicular to a direction for connecting the above source region 20 and the drain region 19 is {100}. A small inclination angle grain boundary having a rotation angle of 70° or less is formed between a plurality of crystal grains constituting the channel region 12. Further, the surface roughness of the channel region 12 is smaller than 20 nm, the internal tensile stress thereof is 109 dyn/cm$^{-2}$ or more, the density of crystal defects contained therein is 1017 m-3 or less, and the density of metal elements contained in the whole semiconductor layer including the channel region 12 is $10^{19}$ cm$^{-3}$ or less.

When the production process and apparatus for forming a polycrystalline semiconductor film by melt recrystallizing a semiconductor thin film shown in FIGS. 3(*a*) to 3(*e*) of Embodiment 1 are used, the same effect is obtained. In this embodiment, the alignment pattern on the insulating substrate can be detected by the level difference of the insulating film 50 in FIGS. 11(*a*) to 11(*c*).

According to this embodiment, a high-quality polycrystalline semiconductor film whose grain boundary, grain size and crystal orientation can be controlled and whose film roughness and crystal defects formed by crystallization have been reduced can be formed on the insulating substrate made from glass or the like. According to this embodiment, a production process and apparatus for forming a low-cost and high-quality polycrystalline semiconductor film, which can reduce the number of production steps, can be applied to a large-area substrate, and have a high throughput are realized. Further, when the polycrystalline semiconductor film of this embodiment is used in an MIS type field effect transistor, the field effect mobility can be controlled to be about 300 cm$^2$/V·s or more, variations in threshold voltage can be suppressed to ±0.2 V or less, and a semiconductor device which operates with high performance and high reliability and is excellent in uniformity among devices can be obtained.

According to the present invention, there is obtained a semiconductor device having on an insulating substrate made from glass or the like a high-quality polycrystalline semiconductor film whose grain boundary, grain size and crystal orientation can be controlled and whose film roughness and crystal defects formed by crystallization have been reduced. There are also provided a production process and apparatus for forming a low-cost and high-quality polycrystalline semiconductor film, which can reduce the number of production steps, can be applied to a large-area substrate, and have a high throughput. Moreover, there are obtained a production process and apparatus for forming on an inexpensive insulating substrate made from glass or the like a high-quality polycrystalline semiconductor film which operates with high performance and high reliability and is excellent in uniformity among devices, as well as a semiconductor device comprising the above polycrystalline semiconductor film.

According to the present invention, a thin film semiconductor device can be formed on a non-crystalline substrate. Further, there is provided a process for producing a polycrystalline semiconductor thin film, which can be used for the above device. Still further, there is provided a production apparatus useful for the above production process.

What is claimed is:

1. A thin film transistor comprising:
a polycrystalline silicon film in a channel region in which a main orientation of the polycrystalline silicon film is {110} with respect to a substrate and a main orientation of the polycrystalline silicon film perpendicular to a direction from a source region to a drain region is {100}.

2. The thin film transistor according to claim 1, further comprising:
a gate electrode formed on the channel region through a gate insulating film.

3. The thin film transistor according to claim 1, further comprising:
a gate electrode formed below the channel region through a gate insulating film.

4. A thin film transistor comprising:
a polycrystalline semiconductor film in a channel region in which a main orientation of the polycrystalline semiconductor film is {110} with respect to a substrate and a main orientation of the polycrystalline semiconductor film perpendicular to a direction from a source region to a drain region is {100}.

5. The thin film transistor accordingly to claim 4, further comprising:
a gate electrode formed on the channel region through a gate insulating film.

6. The thin film transistor accordingly to claim 4, further comprising:
a gate electrode formed below the channel region through a gate insulating film.

* * * * *